(12) United States Patent
Soyseven et al.

(10) Patent No.: US 11,737,307 B1
(45) Date of Patent: Aug. 22, 2023

(54) ELECTRONIC DEVICES HAVING CURVED DISPLAYS WITH SUPPORTING FRAMES

(71) Applicant: Apple Inc., Cupertino, CA (US)

(72) Inventors: Alexis G. Soyseven, Santa Clara, CA (US); Tyler R. Kakuda, Stockton, CA (US); Ying-Chih Wang, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/386,129

(22) Filed: Apr. 16, 2019

Related U.S. Application Data

(60) Provisional application No. 62/680,757, filed on Jun. 5, 2018.

(51) Int. Cl.
| | |
|---|---|
| *H10K 50/84* | (2023.01) |
| *H10K 59/00* | (2023.01) |
| *H10K 59/12* | (2023.01) |
| *H10K 77/10* | (2023.01) |
| *H10K 102/00* | (2023.01) |

(52) U.S. Cl.
CPC ............ *H10K 50/841* (2023.02); *H10K 59/00* (2023.02); *H10K 59/12* (2023.02); *H10K 77/111* (2023.02); *H10K 2102/311* (2023.02)

(58) Field of Classification Search
None
See application file for complete search history.

(56) References Cited

U.S. PATENT DOCUMENTS

| 28,341 | A | 5/1860 | Bennett |
|---|---|---|---|
| 4,349,817 | A | 9/1982 | Hoffman et al. |
| 4,534,813 | A | 8/1985 | Williamson et al. |
| 5,294,815 | A * | 3/1994 | Iechi .................. H01L 27/153 257/80 |
| 5,329,386 | A | 7/1994 | Birecki et al. |
| 5,502,457 | A | 3/1996 | Sakai et al. |
| 5,659,378 | A | 8/1997 | Gessel |
| 6,046,730 | A | 4/2000 | Bowen et al. |
| 6,407,785 | B1 | 6/2002 | Yamazaki |
| 6,467,922 | B1 | 10/2002 | Blanc et al. |
| 6,680,761 | B1 | 1/2004 | Greene et al. |
| 6,845,190 | B1 | 1/2005 | Smithwick et al. |
| 7,228,051 | B2 | 6/2007 | Cok et al. |
| 7,542,209 | B2 | 6/2009 | McGuire, Jr. et al. |
| 7,823,309 | B2 | 11/2010 | Albenda |
| 7,856,161 | B2 | 12/2010 | Tabor |

(Continued)

FOREIGN PATENT DOCUMENTS

KR 20180034832 A 4/2018

*Primary Examiner* — Erik Kielin
(74) *Attorney, Agent, or Firm* — TREYZ LAW GROUP, P.C.; G. Victor Treyz; David K. Cole

(57) ABSTRACT

An electronic device may have a display overlapped by a cover layer. Portions of the surface of the display and cover layer may have curved profiles. The display may include a flexible substrate with bent edge portions protruding from a central region. Gaps may be formed between regions of pixels on a common display substrate or between separate display substrates. A light source may emit light through a gap. Optical components such as sensors may be aligned with windows in the display. The windows may be formed from transparent portions of a display layer that are surrounded by pixels. A frame may be used to support the flexible substrate. The frame may have a metal portion and a polymer portion molded to the metal portion. Openings and other structures in the frame may accommodate components such as optical sensors. Components may be aligned with frame openings and display windows.

14 Claims, 17 Drawing Sheets

(56) References Cited

U.S. PATENT DOCUMENTS

| | | |
|---|---|---|
| 8,045,270 B2 | 10/2011 | Shin et al. |
| 8,723,824 B2 | 5/2014 | Myers et al. |
| 8,824,779 B1 | 9/2014 | Smyth |
| 8,976,324 B2 | 3/2015 | Yang et al. |
| 9,268,068 B2 | 2/2016 | Lee |
| 9,312,517 B2 | 4/2016 | Drzaic et al. |
| 9,342,105 B2 | 5/2016 | Choi et al. |
| 9,509,939 B2 | 11/2016 | Henion et al. |
| 9,591,765 B2 | 3/2017 | Kim et al. |
| 9,755,004 B2 | 9/2017 | Shieh et al. |
| 9,818,725 B2 | 11/2017 | Bower et al. |
| 9,907,193 B2 | 2/2018 | Lee et al. |
| 10,048,532 B2 | 8/2018 | Powell et al. |
| 10,052,831 B2 | 8/2018 | Welker et al. |
| 2006/0016448 A1 | 1/2006 | Ho |
| 2007/0097108 A1 | 5/2007 | Brewer |
| 2008/0144174 A1 | 6/2008 | Lucente et al. |
| 2008/0186252 A1 | 8/2008 | Li |
| 2010/0177261 A1 | 7/2010 | Jin et al. |
| 2010/0238090 A1 | 9/2010 | Pomerantz et al. |
| 2011/0025594 A1 | 2/2011 | Watanabe |
| 2011/0057861 A1 | 3/2011 | Cok et al. |
| 2011/0102300 A1 | 5/2011 | Wood et al. |
| 2011/0242686 A1 | 10/2011 | Watanabe |
| 2012/0218219 A1 | 8/2012 | Rappoport et al. |
| 2012/0288661 A1* | 11/2012 | Wei .................. C03B 23/02 65/102 |
| 2013/0002133 A1* | 1/2013 | Jin et al. ............. H01L 51/524 313/511 |
| 2013/0081756 A1* | 4/2013 | Franklin et al. ........ B29C 53/04 156/221 |
| 2013/0083080 A1 | 4/2013 | Rappoport et al. |
| 2013/0094126 A1* | 4/2013 | Rappoport et al. .... G02B 5/208 361/679.01 |
| 2013/0235560 A1 | 9/2013 | Etienne et al. |
| 2013/0279088 A1* | 10/2013 | Raff et al. ........... G06F 1/1601 361/679.01 |
| 2014/0037257 A1 | 2/2014 | Yang et al. |
| 2014/0092028 A1 | 4/2014 | Prest et al. |
| 2014/0092346 A1 | 4/2014 | Yang et al. |
| 2014/0183473 A1 | 7/2014 | Lee et al. |
| 2014/0240985 A1 | 8/2014 | Kim et al. |
| 2014/0328041 A1 | 11/2014 | Rothkopf et al. |
| 2014/0354920 A1 | 12/2014 | Jang et al. |
| 2015/0093087 A1 | 4/2015 | Wu |
| 2015/0103474 A1* | 4/2015 | Cho .................. B29C 45/0001 361/679.01 |
| 2015/0227227 A1 | 8/2015 | Myers et al. |
| 2015/0261033 A1* | 9/2015 | Shin et al. ........... H05K 5/0086 349/58 |
| 2016/0231784 A1 | 8/2016 | Yu et al. |
| 2016/0234362 A1 | 8/2016 | Moon et al. |
| 2017/0235341 A1 | 8/2017 | Huitema et al. |
| 2017/0357113 A1* | 12/2017 | Yamazaki et al. ... G02F 1/1335 |
| 2018/0052312 A1 | 2/2018 | Jia et al. |
| 2018/0088416 A1 | 3/2018 | Jiang et al. |
| 2018/0368270 A1* | 12/2018 | Seo et al. ................ G06F 1/16 |
| 2018/0372958 A1 | 12/2018 | Karafin et al. |

\* cited by examiner

ELECTRONIC DEVICES HAVING CURVED DISPLAYS WITH SUPPORTING FRAMES

This application claims the benefit of provisional patent application No. 62/680,757, filed Jun. 5, 2018, which is hereby incorporated by reference herein in its entirety.

FIELD

This relates generally to electronic devices, and, more particularly, to electronic devices with displays.

BACKGROUND

Electronic devices such as cellular telephones, tablet computers, and other electronic equipment may include displays for presenting images to a user.

If care is not taken, electronic devices with displays may not have a desired appearance or may be difficult to use satisfactorily. For example, displays may be bulky and unattractive or may not accommodate a desired electronic device shape.

SUMMARY

An electronic device may have a display. The display may be a flexible display such as an organic light-emitting diode display. A display cover layer formed from transparent material may overlap the flexible display.

Portions of the surface of the flexible display may be planar and portions of the surface of the flexible display may have curved profiles. For example, the display may have pixels in a central planar portion and may have pixels in a bent edge portion that protrudes from the central portion. Pixels may be formed on a front face of the device, sidewalls of the device, and/or a rear surface of the device.

Gaps may be formed between regions of pixels on the edges of a common display substrate or may be formed between regions of pixels on the edges of separate display panels. If desired, a light source may emit light through the gap.

Optical components such as sensors may be aligned with windows in the display. The windows may be formed from transparent portions of a display layer that are surrounded by pixels.

A frame may be used to support the flexible display. The frame may have a metal portion and a polymer portion molded to the metal portion. Openings and other structures in the frame may accommodate components such as optical sensors and light sources for emitting light through display gaps. Components may be aligned with frame openings and display windows.

DETAILED DESCRIPTION

Electronic devices may be provided with displays. The displays may have planar surfaces and curved surfaces. For example, a display may have a planar central portion surrounded by bent edges. The bent edges may have curved surface profiles. Arrangements in which displays exhibit compound curvature may also be used. Electronic devices having displays with curved surfaces may have an attractive appearance, may allow the displays to be viewed from a variety of different angles, and may include displays with a borderless or nearly borderless configuration. Internal frame structures such as frames with curved peripheral edge profiles and/or corner surfaces of compound curvature may be used in supporting flexible displays. In some arrangements, a frame may be configured to accommodate internal device components.

Figure 1:
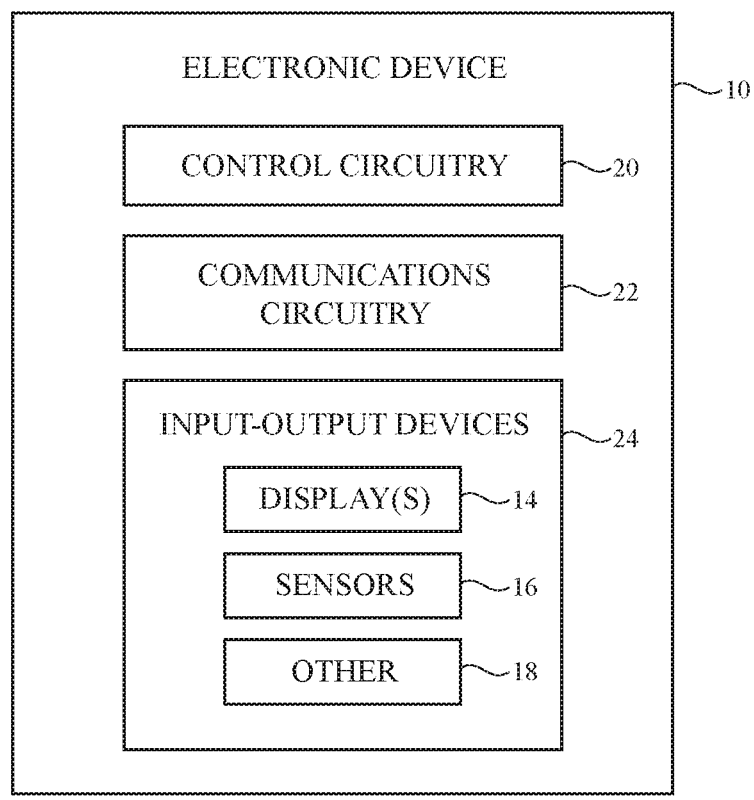
FIG. 1 is a schematic diagram of an illustrative electronic device in accordance with an embodiment.

A schematic diagram of an illustrative electronic device having a display with curved surface portions is shown in FIG. 1. Device 10 may be a cellular telephone, a tablet computer, a laptop computer, a wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc.

To support communications between device 10 and external equipment, control circuitry 20 may communicate using communications circuitry 22. Circuitry 22 may include antennas, radio-frequency transceiver circuitry, and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a 60 GHz link or other millimeter wave link, a cellular telephone link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. During operation, control circuitry 20 may use sensors and other input devices in devices 24 to gather input and can control output devices in devices 24 to provide desired output.

Devices 24 may include one or more displays such as display(s) 14. An output device such as display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Display 14 may have an array of pixels configured to display images for a user. The display pixels may be formed on a substrate such as a flexible substrate (e.g., display 14 may be formed from a flexible display panel). Conductive electrodes for a capacitive touch sensor in display 14 and/or an array of indium tin oxide electrodes or other transparent conductive electrodes overlapping display 14 may be used to form a two-dimensional capacitive touch sensor for display 14 (e.g., display 14 may be a touch sensitive display).

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

If desired, electronic device 10 may include additional components (see, e.g., other devices 18 in input-output devices 24). The additional components may include haptic output devices, audio output devices such as speakers, light producing output devices such as light-emitting diodes for status indicators, light sources such as light-emitting diodes (e.g., crystalline semiconductor light-emitting diodes) that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
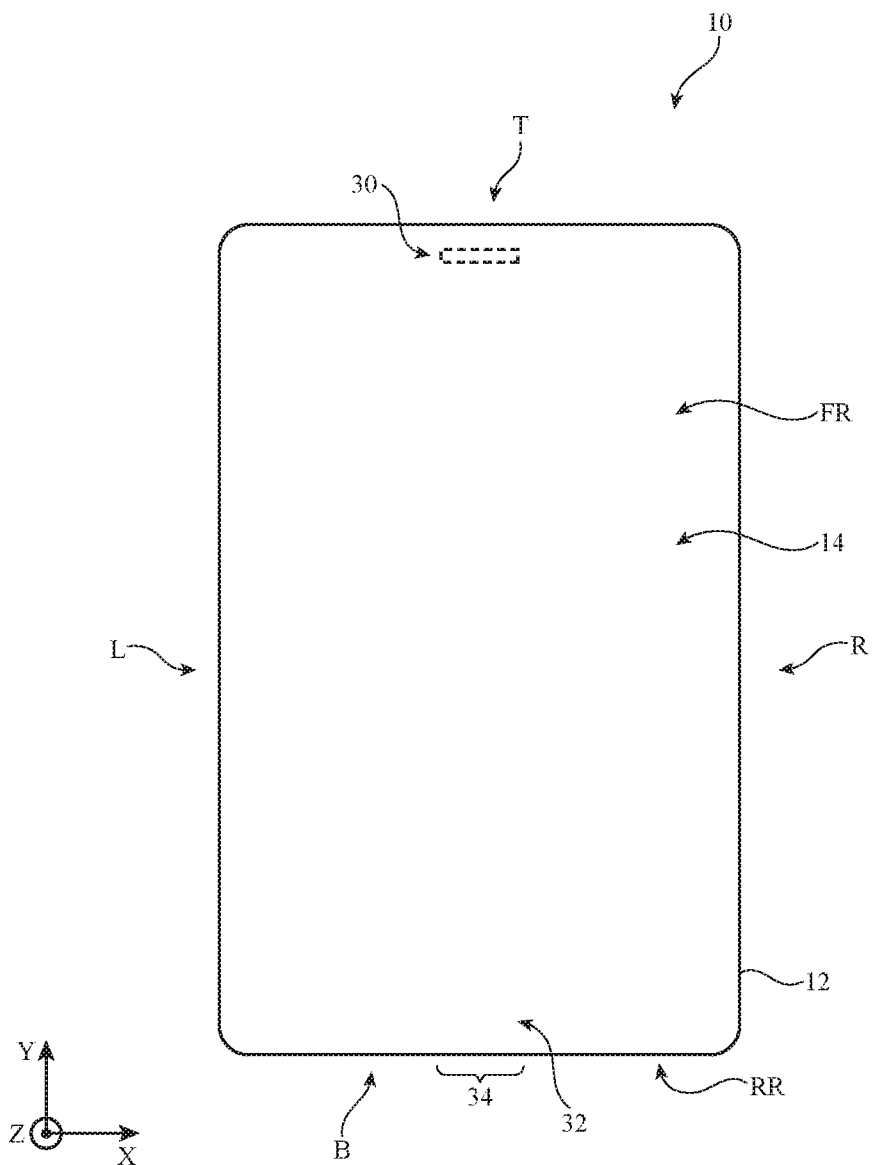
FIG. 2 is a top view of an illustrative electronic device in accordance with an embodiment.

FIG. 2 is a front (plan) view of electronic device 10 in an illustrative configuration in which display 14 covers some or all of the front face FR of device 10. Opposing rear face RR of device 10 may be covered by a housing wall formed from glass, metal, polymer, and/or other materials. Rear face RR may be free of display pixels and/or may be partly or fully covered by display 14.

Device 10 may include a housing (e.g., housing 12) that forms sidewall structures for device 10 and/or internal supporting structures (e.g., a frame, midplate member, etc.). In some illustrative arrangements, sidewall portions of device 10 may be covered with portions of display 14. In the example of FIG. 2, device 10 is characterized by four peripheral edges: upper edge T, lower edge B, left edge L, and right edge R. Upper edge T and opposing lower edge B may run parallel to each other and parallel to the X axis of FIG. 2. Left edge L and opposing right edge R may run parallel to each other and parallel to the Y axis of FIG. 2. Front face FR and rear face RR may be planar (e.g., two parallel planes offset by a distance along the Z axis) and/or may include curved portions.

Touch sensor circuitry such as two-dimensional capacitive touch sensor circuitry may be incorporated into one or more display panels in device 10 as separate touch sensor panels overlapping display pixels or may be formed as part of one or more display panels in device 10. Touch sensors may be formed on front face FR, rear face RR, and/or edges (sidewall faces) T, B, R, and/or L. If desired, icons and other images for virtual buttons may be displayed by the pixels of device. For example, virtual buttons and/or other images may be displayed on front face FR, rear face RR, and/or sidewall structures in device 10 such as edges T, B, R, and/or L and may overlap touch sensor circuitry. Haptic output devices may be used to provide haptic feedback when virtual buttons are selected (as an example).

Device 10 of FIG. 2 has a rectangular outline with four rounded corners. If desired, device 10 may have other shapes. For example, device 10 may have a shape that folds and unfolds along a bend (folding) axis and may include a display that overlaps or that does not overlap the bend axis, may have a shape with an oval footprint or circular outline, may have a cubic shape, may have a pyramidal, cylindrical, or conical shape, or may have other suitable shapes. The configuration of FIG. 2 is illustrative.

If desired, openings may be formed in the surfaces of device 10. For example, a speaker port and optical windows for an ambient light sensor, an infrared proximity sensor, and a depth sensor may be formed in a region such as upper region 30 of front face FR. A finger print sensor, touch sensor button, force-sensitive button, or other sensor that operates through display 14 may be formed under the portion of display in lower region 32 on front face FR and/or other portions of front face FR and/or other external surfaces of device 10. An optional opening for a connector (e.g., a digital data connector, analog signal connector, and/or power connector) may be formed in portion 34 of the lower sidewall of device 10 running along lower edge B. This opening may be omitted when power is received wirelessly or is received through contacts that are flush with the surface of device 10 and/or when data is transferred and received wirelessly using wireless communications circuitry in circuitry 22 or through contacts that are flush with the exterior surface of device 10.

Figure 3:
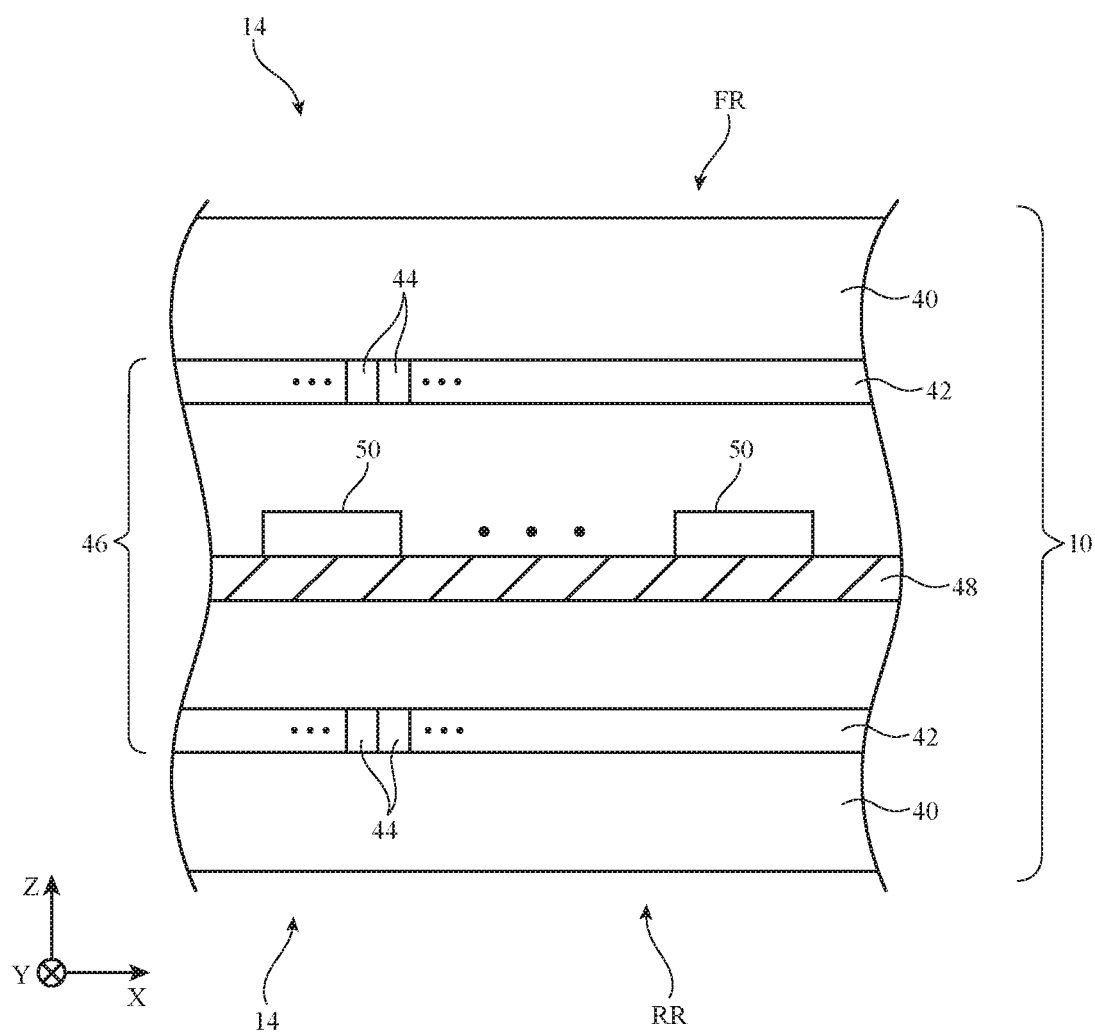
FIG. 3 is a cross-sectional side view of an illustrative electronic device in accordance with an embodiment.

FIG. 3 is a cross-sectional side view of an illustrative electronic device. As shown in FIG. 3, display 14 may be formed on front face FR and/or rear face RR of device 10. Display 14 may include one or more transparent protective layers such as display cover layer 40. Display cover layer 40 may be formed from transparent material such as clear glass, polymer, sapphire or other crystalline material, or other transparent material. Display layers such as layers 42 may have arrays of pixels 44 that form images. The pixel arrays (e.g., layers 42) may sometimes be referred to as pixel layers, pixel array layers, displays, display structures, display layers, or display panels. For example, layers 42 may be formed from organic light-emitting diode displays. In the example of FIG. 3, device 10 has a first display 14 (or first display portion of a display panel or other display structure) formed from a first pixel array 42 on front face FR. This first pixel array is visible in the -Z direction through display cover layer 40 on front face FR. Device 10 of FIG. 3 also has a second display 14 (or second display portion of the display panel or other display structure) formed from a second pixel array 42 on rear face RF. This second pixel array is visible in the +Z direction through display cover layer 40 on rear face RR. The front and/or rear surfaces formed by display cover layer(s) 40 may be planar (as shown in FIG. 3) or may have a curved profile.

If desired, the second display 14 of device 10 may be omitted. For example, pixel array 42 on rear face RR may be omitted. In this configuration, the inner surface of layer 40 on rear face RR may be coated with a black masking material or other opaque coating and/or may be coated with colored and/or shiny structures. Coating material can be patterned to form logos, text, and other visual elements. This type of arrangement may be used to hide internal components in interior 46 of device from view from the exterior of device 10. As shown in FIG. 3, for example, device 10 may include electrical components 50 in interior 46 (e.g., integrated circuits, sensors and other input-output devices, control circuitry, display layers 42 such as organic light-emitting diode panels or other display layers, etc.). Electrical components 50 may, if desired, be mounted on printed circuits such as printed circuit 48 (e.g., flexible printed circuits and/or printed circuits formed from rigid printed circuit board material). In configurations such as these in which the lower pixel array of device 10 is omitted, the portion of device 10 on rear face RR (e.g., layer 40) may be formed from metal (e.g., a stainless steel or aluminum layer). For example, device 10 may have a rear housing wall formed from metal. Device 10 may also have housing walls formed from opaque glass, transparent glass coated with opaque materials such as ink or metal, and/or other housing wall materials.

In some configurations for device 10, an opaque material such as metal or opaque polymer may form some or all of the sidewalls of device 10. As an example, metal that forms some or all of a rear housing wall on rear face RR of device 10 may protrude upwardly along the edges of device 10 to form some or all of the sidewalls for device 10. As another example, a peripheral metal band that forms some or all of the sidewalls of device 10 may extend around the rectangular periphery of device 10 (e.g., along upper edge T, right edge R, lower edge B, and left edge L). Sidewalls may have vertically extending planar surfaces and/or may exhibit other surface profiles (e.g., curved profiles).

If desired, some or all of the sidewalls of device 10 may be formed from clear material and may overlap light-producing components. This material may, as an example, be part of display cover layers 40 of FIG. 3 (e.g., an extending piece of glass, polymer, crystalline material, or other transparent display cover layer material). Because clear layers of glass, plastic, crystalline material, and/or other clear layers of material in device 10 may enclose and protect internal device components, these outer layers of material in device 10 serve as an enclosure (housing 12) for device 10.

In configurations for device 10 in which sidewalls have transparent portions formed from extending portions of display cover layers 40 or other transparent material, the sidewalls may overlap light-emitting components. Transparent sidewalls may have planar and/or curved surfaces and may be formed from clear glass, clear polymer, transparent crystalline material such as sapphire, and/or other transparent protective material. Displays (pixel arrays), light-emitting diodes covered with diffusing material, light-emitting diodes covered with patterned masks (e.g., opaque coatings with icon-shaped openings or openings of other shapes), and/or other light-emitting devices may be placed under clear sidewalls.

During operation, light emitted from the pixels or other light-emitting components under the sidewalls may pass through the sidewalls. In arrangements in which display panels are placed under transparent sidewalls, images may be displayed through the sidewalls. The images may form parts of images being displayed on front face FR and/or rear face RR and/or may be separate images. For example, a photograph may extend across front face FR and some or all of the sidewalls of device 10 and/or a photograph may cover only front face FR while virtual buttons are displayed on the sidewalls of device 10. In arrangements in which one or more light-emitting diodes and an overlapping diffuser are placed under transparent sidewalls, diffuse light may be emitted through the sidewalls.

In addition to optional opaque housing structures such as metal housing walls or opaque walls formed from other materials, device 10 may include display cover layers 40 and other structures formed from transparent glass, transparent polymer, and/or other transparent material. These materials may surround the interior of device 10 and thereby serve as a housing for device 10 as well as serving as protective layers for pixel arrays and other light-emitting components. In the example of FIG. 3, the front surface of device 10 is formed by a planar surface of display cover layer 40 on front face FR and the rear surface of device 10 is formed by a planar surface of display cover layer 40 on rear face RR. In general, device 10 may have planar surface portions and/or curved surface portions (surface portions with curved profiles) and these portions may be formed by display cover layers, other layers formed from glass, polymer, sapphire or other crystalline material, ceramic, or other potentially transparent materials, metal, wood, or other materials.

Figure 4:
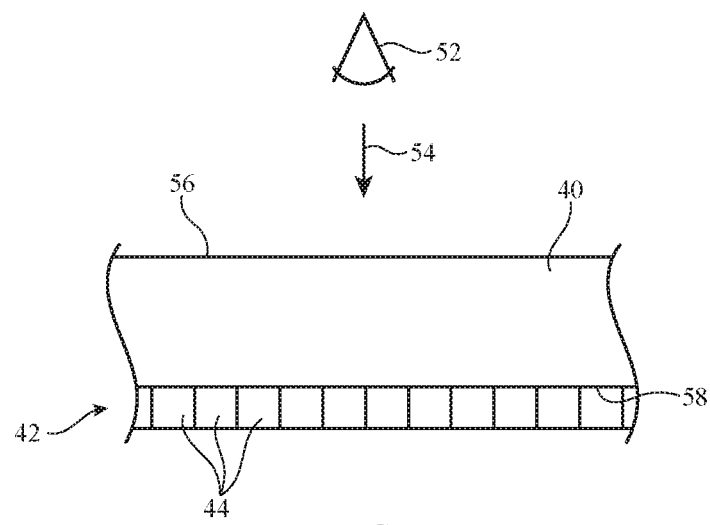
FIG. 4 is a cross-sectional side view of an illustrative planar portion of a display cover layer and pixel array in accordance with an embodiment.
Figure 5:
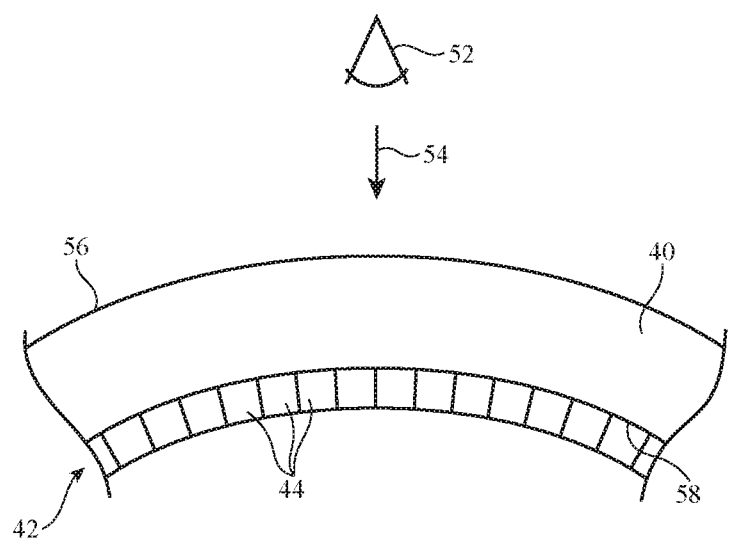
FIG. 5 is a cross-sectional side view of an illustrative curved portion of a display cover layer and pixel array in accordance with an embodiment.

Transparent portions of device 10 may overlap pixels or other light-emitting components that emit light that is visible to a user. In the illustrative arrangements of FIGS. 4 and 5, an array of pixels 44 in layer 42 is configured to emit light that passes through display cover layer 40 for viewing by viewer 52 (e.g., in direction 54 and/or other directions from the exterior of device 10). The inner and outer surface of layers 40 (and other layers enclosing the interior of device 10) may be planar and/or curved. In the illustrative configuration of FIG. 4, outer surface 56 of layer 40 and inner surface 58 of layer 40 are planar. Inner surface 58 of FIG. 4 may be curved or partly planar and partly curved, if desired. In the illustrative configuration of FIG. 5, outer surface 56 of layer 40 is curved and inner surface 58 of layer 40 is curved. Inner surface 58 may, if desired, be planar or may have planar and curved surface profile portions.

Figure 6:
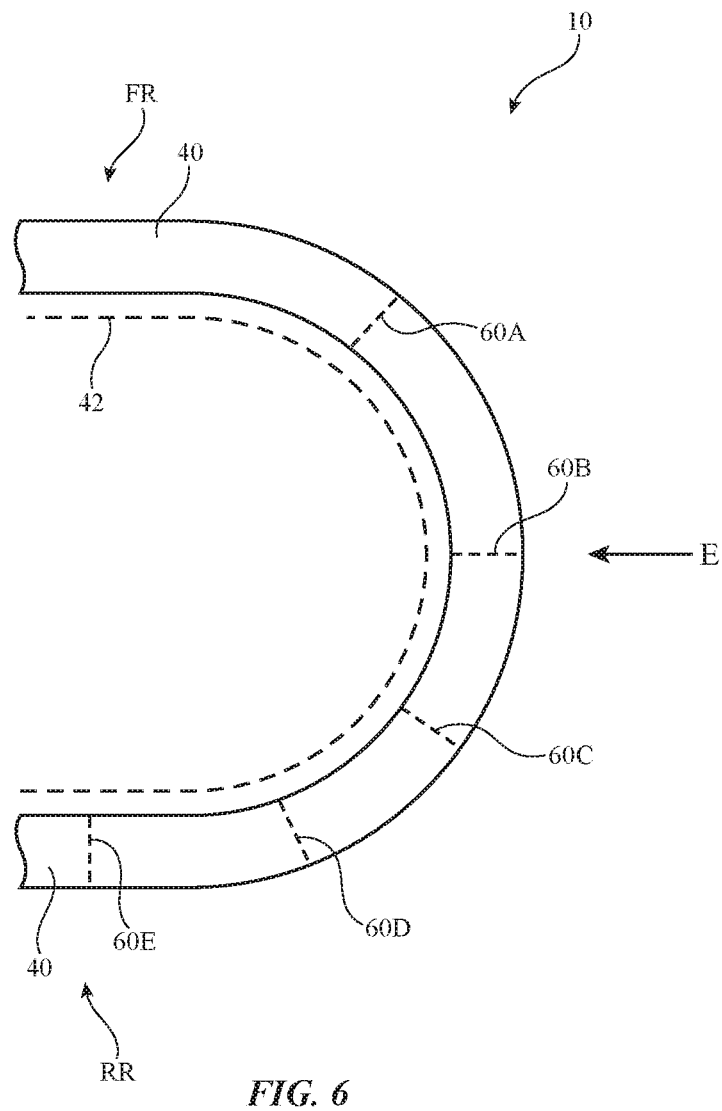
FIG. 6 is a cross-sectional side view of an illustrative sidewall portion of an electronic device in accordance with an embodiment.

Device 10 may have upper and/or lower surfaces (e.g., external surfaces 56 on front face FR and rear face RR, respectively) that are planar and/or curved. The edges of device 10 may have sidewalls with planar and/or curved portions (e.g., surfaces with straight and/or curved profiles). As shown in FIG. 6, for example, the sidewalls of device 10 along one or more edges such as edge E of device 10 (e.g., left edge L, right edge R, upper edge T, lower edge B, and/or the corners of device 10) may have a curved outer surface.

Edge E may be transparent (e.g., the entire sidewall of device 10 may be transparent and may be formed from extended portions of upper and lower display cover layer(s)) and/or one or more portions of the curved sidewall of edge E may be opaque (e.g., formed from glass or other material that is coated with opaque material, formed from opaque polymer, formed from metal, and/or formed from other opaque structures). Opaque structures (e.g., metal housing wall portions) may extend along one or more portions of edge E (e.g., metal or other opaque material may form the portion of edge E between locations 60A and 60B, between locations 60B and 60C, between locations 60C and 60D, between locations 60D and 60E, between locations 60A and 60C, between locations 60B and 60D, between locations 60C and 60E, or between other suitable locations on edge E. There may be a single strip of metal housing material that runs around all four peripheral edges E of device 10, there may be a pair of discrete strips of metal housing material that run around all four peripheral edges E in parallel, there may be no non-glass structures on edges E, and/or there may be other suitable structures on edges E.

Display layer 42 may be formed from a single panel (e.g., a single flexible organic light-emitting diode display panel having a polyimide substrate or other flexible substrate with bent edge portions), may be formed from multiple panels (e.g., multiple panels separated from one or more gaps), may be formed from panels with slots and other openings, and/or may be formed from other types of displays. Portions of display layer 42 (e.g., all of layer 42 and/or the pixels and/or other structures of layer 42) may be omitted wherever layer 42 is overlapped by a metal portion of edge E and/or other opaque structures in edge E. For example, edge E may be formed from glass everywhere except between locations 60B and 60D. The portion of edge (sidewall) E between locations 60B and 60D may be formed from metal (as an example). In this type of scenario, no display layer 42 (or at least no pixels 44) may be overlapped by the metal and pixels 44 and display layer 42 may be present under the glass portions of edge E and/or display cover layer 40 on front face FR and/or rear face RR.

Figure 7:
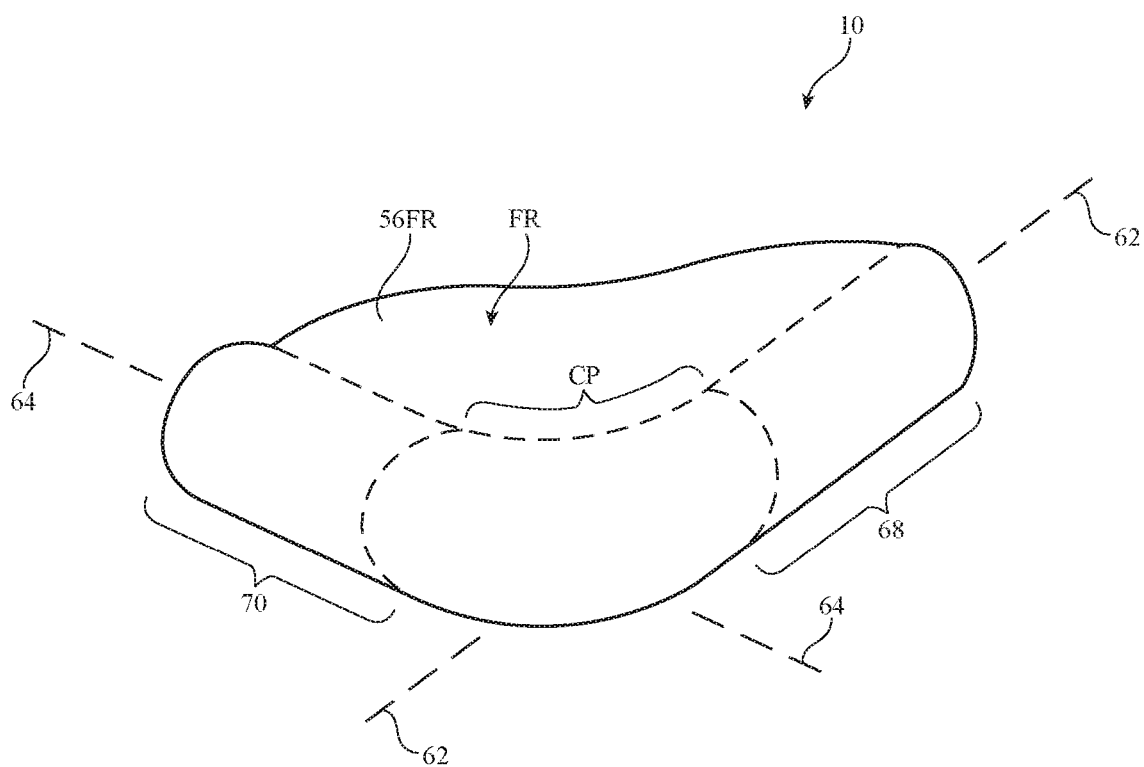
FIG. 7 is a perspective view of an illustrative corner portion of an electronic device in accordance with an embodiment.

If desired, device 10 may have external surfaces with compound curvature. A perspective view of an illustrative corner portion of device 10 is shown in FIG. 7. In the example of FIG. 7, device 10 has edge portions (sidewalls) 68 and 70 with surfaces that curve about axes 62 and 64, respectively. These portions extend along the straight sides of device 10 and are characterized by curved surfaces that can be flattened into a plane without distortion (sometimes referred to as developable surfaces). At the corner of device 10, device 10 has curved surface portions CP with compound curvature (e.g., a surface that can only be flattened into a plane with distortion, sometimes referred to as a surface with Gaussian curvature). Each of the four corners of device 10 may have this arrangement, if desired.

Flexible displays such as organic light-emitting diode displays with flexible polyimide substrates or other bendable polymer substrates can be bent about axes such as axes 62 and 64 to form curved surfaces in portions 68 and 70. In compound curvature regions such as corner regions of device 10, display 14 can be formed from materials that stretch (e.g., displays formed from mesh-shaped elastomeric substrate material), may be formed from flexible displays that are patterned to create flexible strips and other structures that can be bent to cover at least part of the compound curvature regions, and/or may use optical structures (e.g., lenses, etc.) to redirect light emitted from pixels in a display to surfaces with compound curvature. Configurations in which display surfaces with curved profiles are accommodated using a flexible display layer such as a flexible organic light-emitting diode display are described herein as an example.

Figure 8:
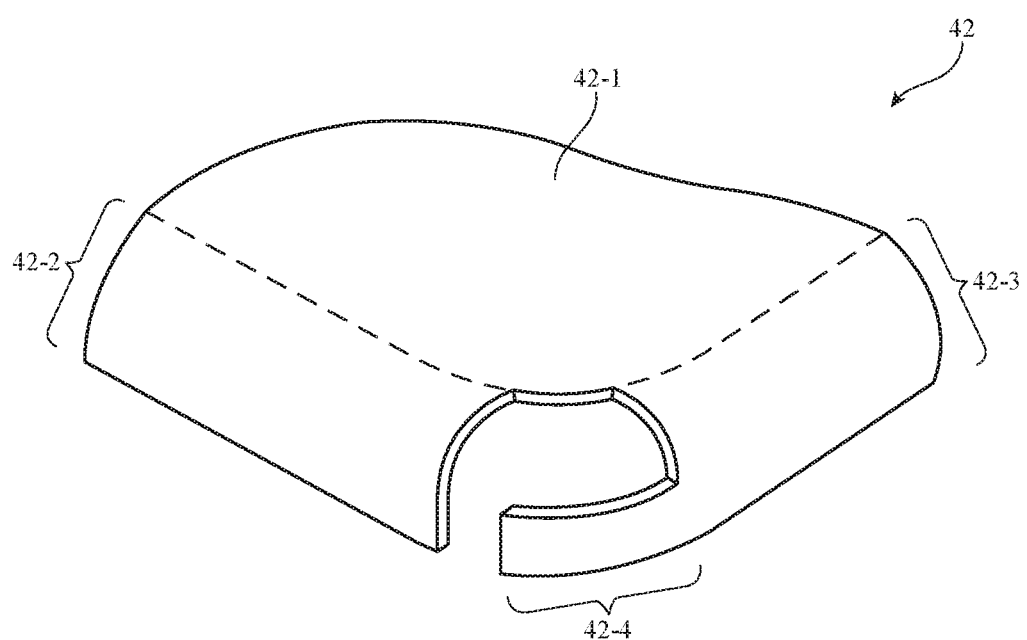
FIG. 8 is a perspective view of an illustrative corner portion of a flexible display layer in an electronic device in accordance with an embodiment.

With one illustrative configuration, a flexible display layer has one or more protrusions that are bent to accommodate portions of the display that are curved. Consider, as an example, flexible display layer 42 of FIG. 8. As shown in FIG. 8, flexible display layer 42 (e.g., an organic light-emitting diode display) may have a rectangular central portion 42-1. Along one, two, three, or four of the peripheral edges of portion 42-1, display layer 42 has elongated strip-shaped protrusions such as protrusions 42-2 and 42-3 that run parallel to the edges of display layer 42. These portions may be bent about bend axes that run parallel respectively to each of the peripheral edges of portion 42-1. One or more protrusions of display layer 42 may be bent to accommodate display surfaces with curved profiles. For example, protrusions such as corner protrusion 42-4 of FIG. 8 may be located in each of the four corners of display layer 42 and may be bent to provide pixels for the rounded corners of display 14. Corner protrusions such as protrusion 42-4 may be overlapped by curved portions of display cover layer 40 (e.g., portions of cover layer 40 with surfaces of compound curvature).

Figure 9:
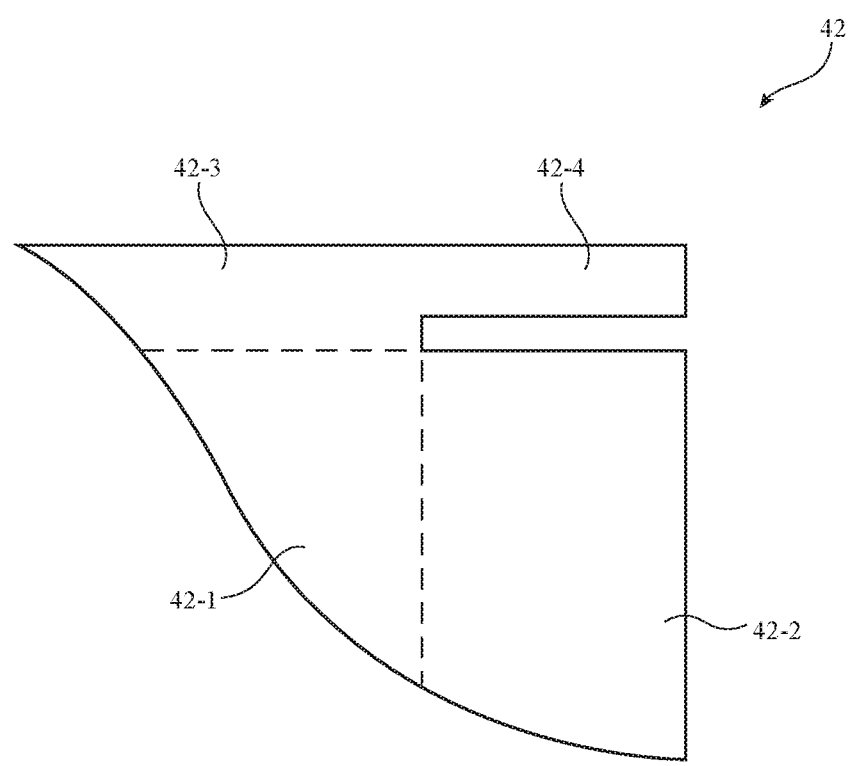
FIG. 9 is a top view of a flexible display layer of the type shown in FIG. 8 in an unbent configuration in accordance with an embodiment.
Figure 10:
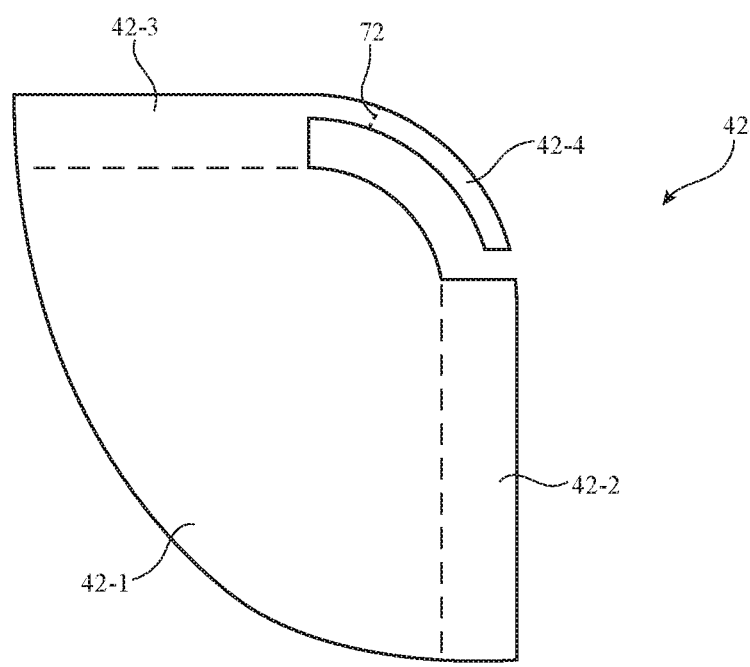
FIG. 10 is a top view of an illustrative corner portion of an electronic device in which a flexible display layer of the type shown in FIGS. 8 and 9 has been mounted in accordance with an embodiment.

FIG. 9 is a top view of flexible display layer 42 of FIG. 8 in an unbent configuration (prior to bending to form a display with curved edges, corners of compound curvature, etc.). FIG. 10 is a top view of a corner portion of flexible display layer 42. As shown in FIG. 10, protrusion 42-4 (which may sometimes be referred to as a tab) may be curved to accommodate a rounded corner portion of display 14. Protrusion 42-4 may be formed as an integral portion of display layer 42 (e.g., portions 42-1, 42-2, 42-3, and 42-4 may be formed from a common substrate). If desired, a separate display substrate may be used in forming portion 42-4 of display 14. For example, the pixels of protrusion 42-4 may be formed on a display substrate that is separated from portion 42-3 at location 72.

Figure 11:
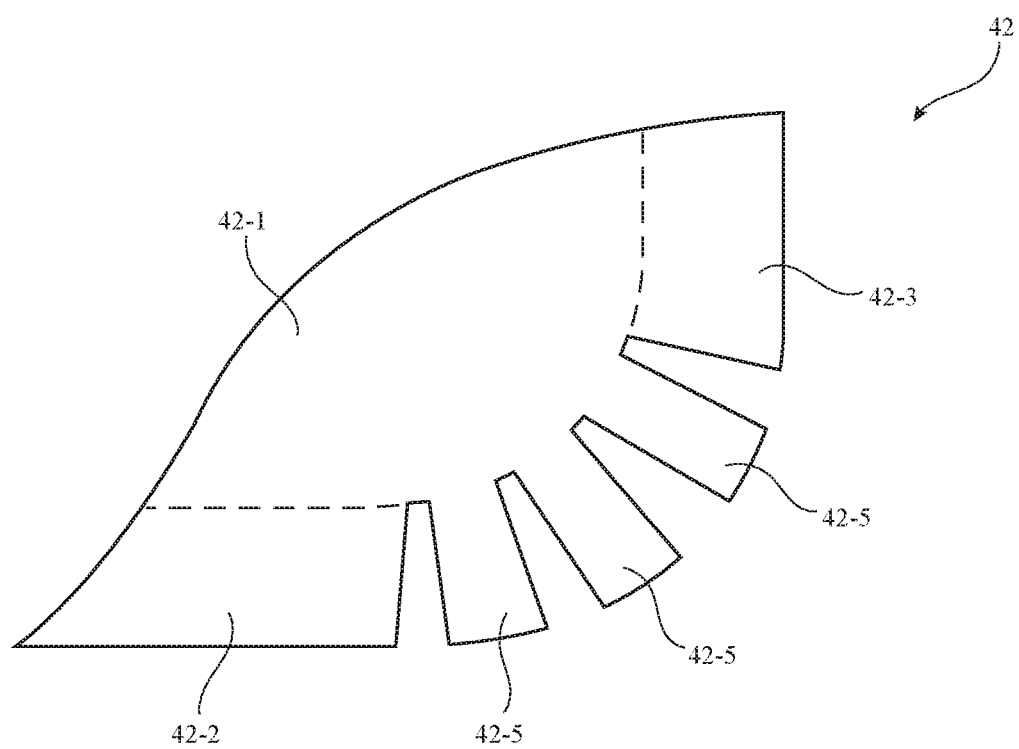
FIG. 11 is a top view of an illustrative corner portion of a flexible display layer with corner protrusions in an unbent configuration in accordance with an embodiment.

In general, any suitable slots or other cuts may be made in flexible display layer 42 to allow display layer 42 to be bent and otherwise folded to form a display with curved portions (e.g., without creating excessive buckling and wrinkling of display layer 42). Another illustrative arrangement is shown in FIG. 11. In the example of FIG. 11, central portion 42-1 of display layer 42 has a rectangular shape, four edge protrusions such as edge protrusions 42-3 and 42-2 run along the four respective peripheral edges of portion 42-2, and the corner of display layer 42 has a series of finger-shaped protrusions 42-5 that extend radially outwards from portion 42-1 (when display layer 42 is in an unbent configuration as shown in FIG. 11). When it is desired to form display 14, protrusions 42-5 may be bend downwardly to cover the corner of device 10 (e.g., to form portions of display layer 42 that are overlapped by a display cover layer having a corner surface of compound curvature).

Figure 12:
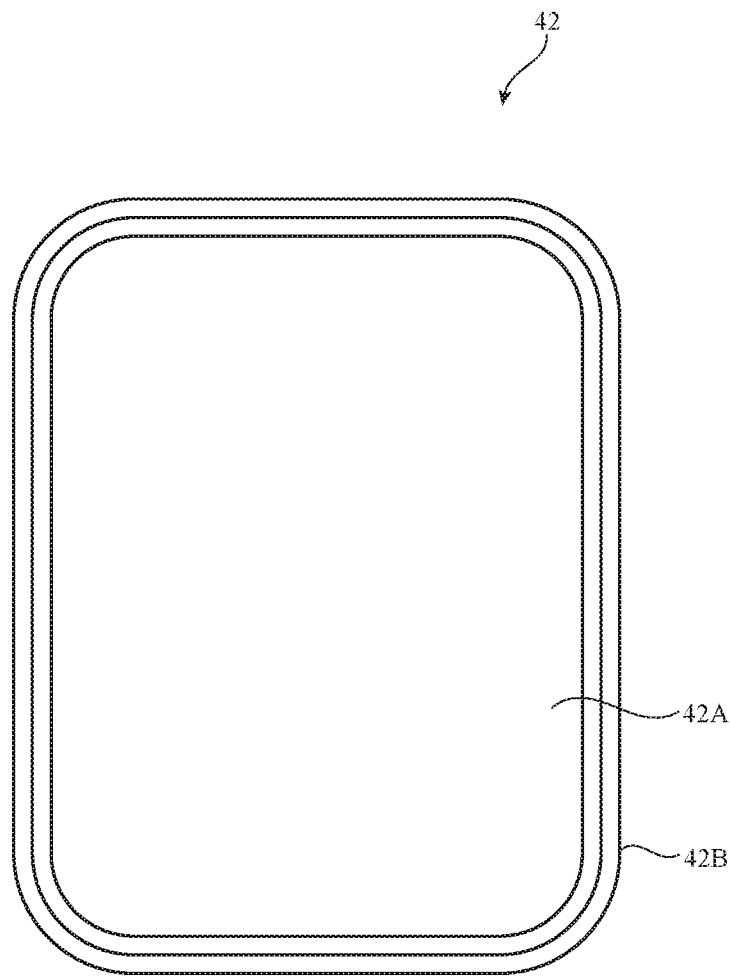
FIG. 12 is a top view of an illustrative display layer having a central planar panel and a strip-shaped panel that wraps around a peripheral edge of a device in accordance with an embodiment.

FIG. 12 is a top view of a display layer arrangement that uses two separate display panels (e.g., two separate organic light-emitting diode display substrates) for forming an upper portion of display 14. In this arrangement, central portion 42A may have a rectangular shape. The corners of central portion 42A may be rounded. To form portions of display 14 that are visible through transparent sidewalls of device 10 (e.g., sidewall portions of display cover layer 40) while accommodating the rounded corners of the display, display layer 42 of FIG. 12 has a strip-shaped sidewall portion 42B. Portion 42B may be oriented so that the surface of portion 42B is vertical (e.g., so that surface normals of portion 42B are orthogonal to the surface normal of portion 42A). This allows portion 42B to wrap around the peripheral edge of portion 42A without buckling.

As these examples demonstrate, display 14 may include one or more display panels (e.g., one or more distinct portions of display layer 42) with protrusions that are bent to accommodate the curved surfaces of display 14 while avoiding wrinkling of the flexible substrate material forming display layer 42. Display layers 42 of this type may be mounted to interior surfaces of display cover layer 40 and/or may be supported by internal frame structures. The inwardly facing surfaces of display cover layer 40 may be concave. To simplify assembly, it may be desirable to mount flexible display layers 42 on a convex outer surface or other supporting surface of a frame structure that is subsequently installed within a recessed portion of display cover layer 40.

Figure 13:
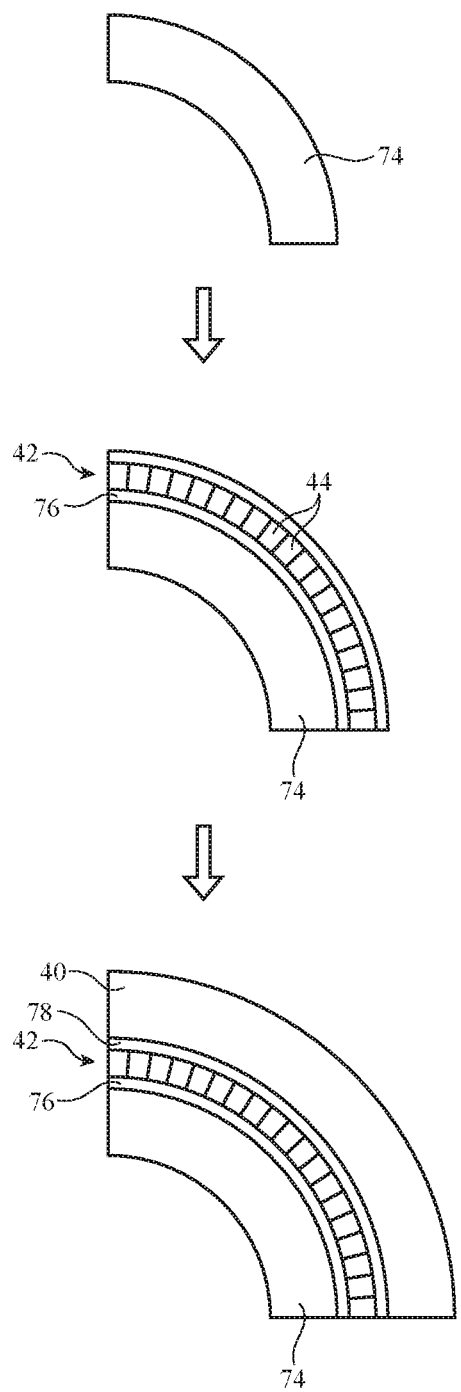
FIG. 13 is a diagram showing how a flexible display may be mounted to a supporting frame prior to installation adjacent to an inner surface of a display cover layer in accordance with an embodiment.

Consider, as an example, the assembly operations illustrated in FIG. 13. Device 10 may include an internal flexible display support structure such as frame 74. Frame 74 may be formed from metal, polymer, other materials, and/or combinations of two or more of these materials. For example, frame 74 may have a metal portion and a polymer portion or may be formed solely from metal or solely from polymer (as examples). The outer surfaces of frame 74 may be configured to serve as supporting surfaces for flexible display layer 42 and may be planar and/or may have curved surface profiles (e.g., surfaces of compound curvature).

Initially, frame 74 may be uncovered with display structures, as shown in the upper portion of FIG. 13. Flexible display layer 42 may then be attached to the outer surface of frame 74 using adhesive (e.g., polymer) 76 or other attachment mechanisms (e.g., clips or other fasteners, etc.), as shown in the middle portion of FIG. 13. As shown in the lower portion of FIG. 13, display cover layer 40 may be used to cover the outer surface of display layer 42. If desired, a layer of adhesive 78 may be used in attaching display layer 42 to the inner surface of display cover layer 40. In areas in which the surface of frame 74 is planar, display layer 42 and the corresponding inner surface of display cover layer 40 may be planar. In areas in which the surface of frame 74 has a curved surface profile (e.g., a surface of compound curvature), display layer 42 may be configured to be attached to this surface without excessive buckling (e.g., using wrapped protrusions, multiple substrate portions, etc.) and display cover layer 40 may have a matching inner surface with a curved surface profile. The outer surface of display cover layer 40 in areas where the inner surface is curved may also be curved (as an example).

Figure 14:
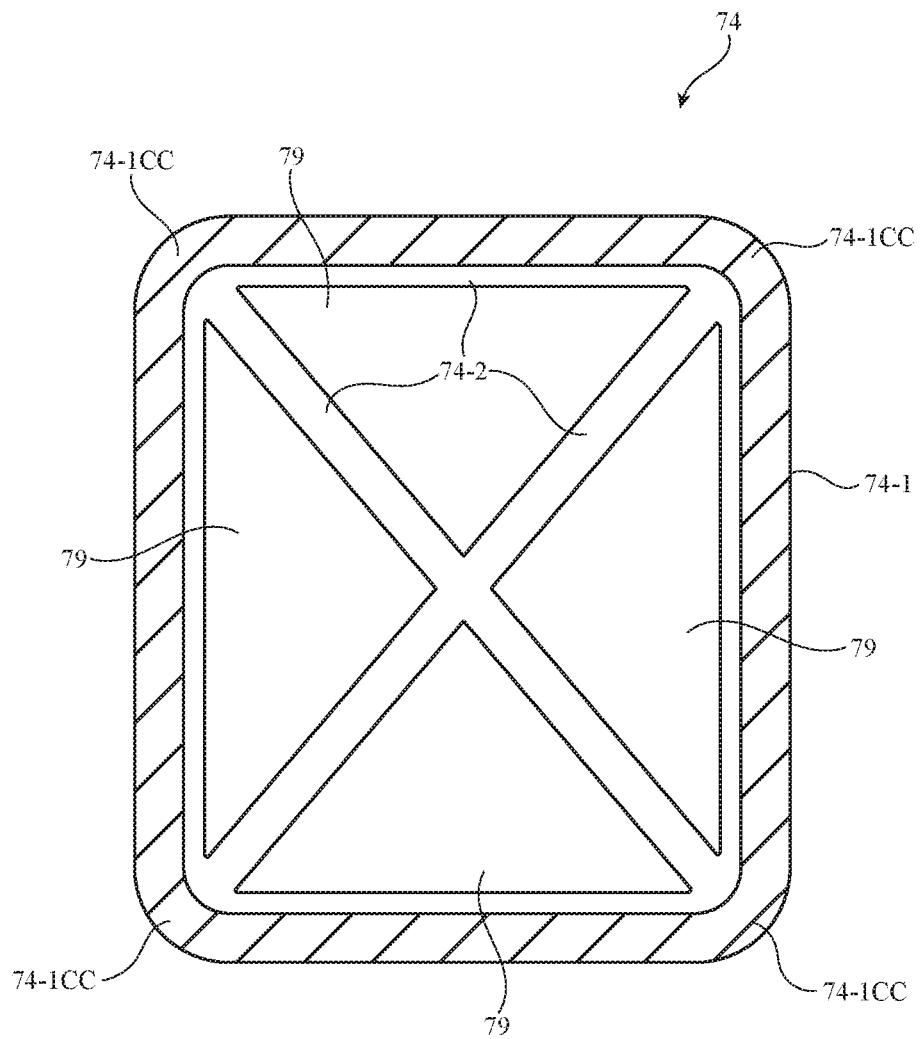
FIG. 14 is a diagram of an illustrative display frame having a metal chassis and an overmolded plastic chassis in accordance with an embodiment.

An illustrative display frame is shown in FIG. 14. As shown in FIG. 14, display frame 74 may include metal frame portion such as metal portion 74-2 and a polymer frame portion such as polymer portion 74-1. Polymer portion 74-1 may, if desired, be overmolded onto metal portion 74-2 or other attachment mechanisms (adhesive, fasteners, etc.) may be used in coupling portions 74-1 and 74-2 together. Portions 74-1 and/or 74-2 may have planar surfaces and/or curved surface profiles to help support display layer 42 in a desired shape. For example, frame portion 74-1 may have portions with curved surfaces along four respective display edges (e.g., upper, lower, left, and right edges in FIG. 14) and may have portions with surfaces of compound curvature such as illustrative compound curvature portions 74-1CC in the rounded corners of frame 74. In the example of FIG. 14, frame portion 74-2 has openings 79 to help reduce the weight and volume occupied by frame 74. Configurations without openings or with openings of other shapes may also be used. In device 10, display layer 42 has pixels that overlap the planar portions of frame 74 formed by portion 74-2 and has pixels along the curved edges of device 10 that overlap the curved edge surfaces of frame portion 74-1.

Figure 15:
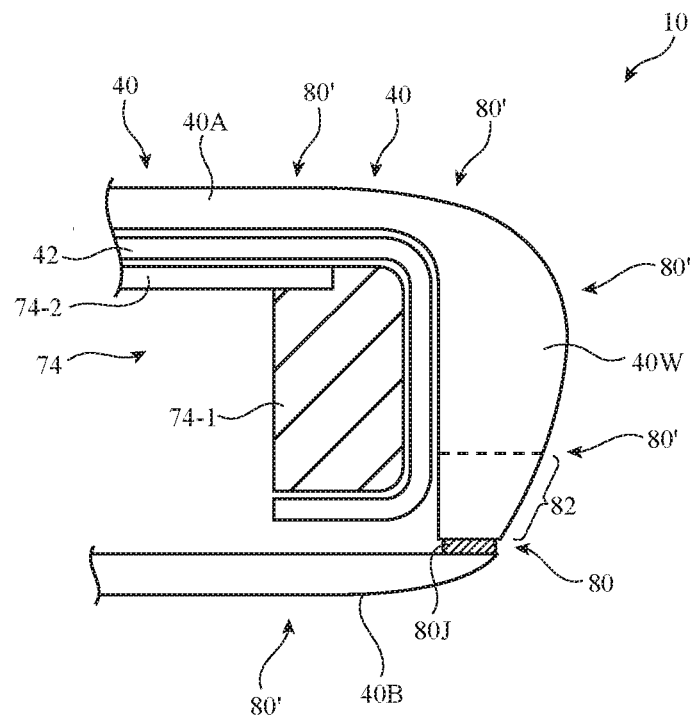
FIGS. 15 and 16 are cross-sectional side views of illustrative edge portions of electronic devices in which flexible displays have been curved around curved outer surfaces of supporting display frames in accordance with embodiments.

FIG. 15 is a cross-sectional side view of an edge portion of device 10 in an illustrative configuration in which display cover layer 40 has a sidewall of enlarged thickness. As shown in FIG. 15, display layer 40 may have planar portions that overlap the pixels of planar portions of display layer 42 and may have curved sidewalls such as sidewall portion 40W. The thickness of sidewall portion 40W (e.g., the distance from the inner surface of sidewall portion 40W relative to the opposing ouster surface of sidewall portion 40W taken along the surface normal of display layer 42) may be greater than the thickness of the planar portions of display cover layer 40 to enhance the resistance of display cover 40 to damage during impact events.

To facilitate device assembly, display cover layer 40 may have an upper portion 40A and a mating lower portion 40B that are joined at seam 80 (e.g., using coupling joint 80J, which may be formed from adhesive, glass welds, etc.). Seam 80 of FIG. 15 is formed at the bottom of the sidewall formed from portion 40W. If desired, seam 80 may be located at other locations along the edge of device 10 or near to the edge of device 10, as illustrated by illustrative seam locations 80'. All of the sidewalls and front and rear faces of display cover layer 40 may be formed from transparent display cover layer material and/or one or more portions of display cover layer 40 may be replaced by metal or other opaque housing structures. As an example, portion 82 of device 10 may be formed from a peripheral metal band or other metal housing member that extends around the rectangular periphery of device 10 (e.g., the four peripheral edges and four rounded corners of device 10).

Frame 74 of FIG. 15 includes frame portion 74-2 (e.g., a metal frame structure) and frame portion 74-1 (e.g., a polymer frame structure). Portion 74-1 may, if desired, be formed from polymer that is molded over the edges of frame portion 74-2. Display layer 42 may be attached to the outer surface of frame 74 so that display layer 42 is adjacent to the inner surface of display cover layer 40 when mounted in device 10. Display layer 42 may cover some or all of the front face of device 10, some or all of the sidewalls of device 10, and/or some or all of the rear face of device 10. If desired, display layer 42 may be omitted from some or all of the front face, sidewall, and/or rear face of device 10.

Figure 16:
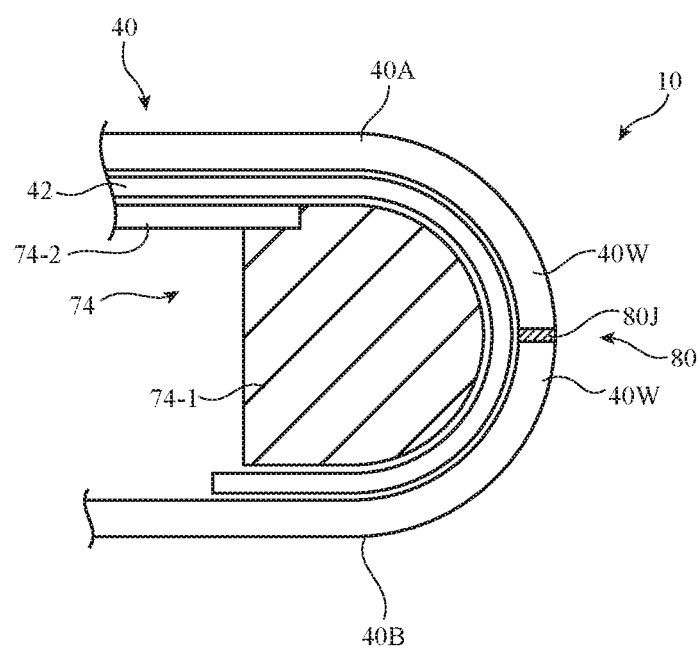

FIG. 16 is a cross-sectional side view of an illustrative edge portion of device 10 in a configuration in which display cover layer 40 has symmetrical upper and lower portions. As shown in FIG. 16, upper portion 40A and lower portion 40B are configured to be joined (e.g., using adhesive, laser welding, etc.) along seam 80. Seam 80 of FIG. 16 is located in the middle of the sidewall of layer 40. If desired, sidewall portions 40W of display layer portions 40A and 40B may have a greater thickness than the planar portions of portions 40A and 40B or other configurations may be used for display layer 40. The arrangement of FIG. 16 is illustrative.

Figure 17:
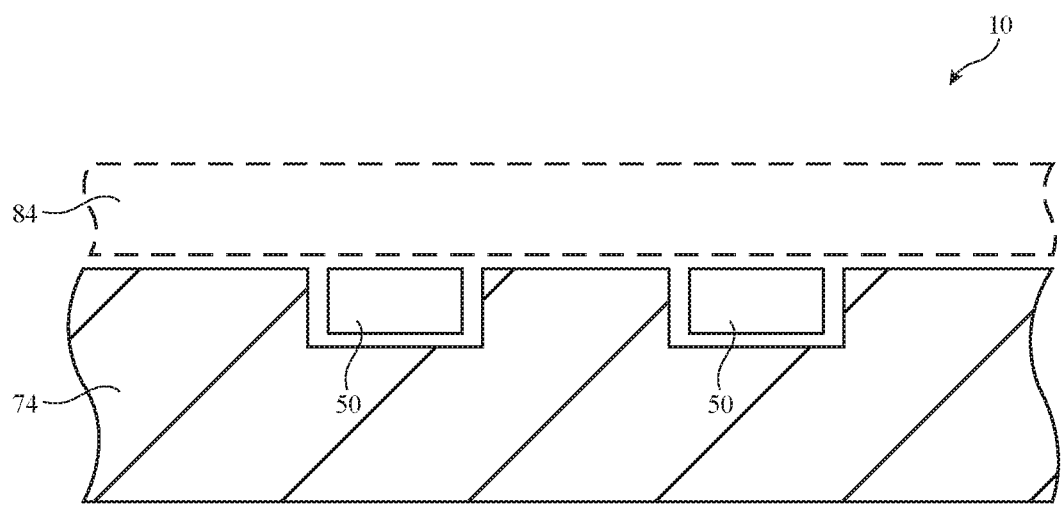
FIG. 17 is a cross-sectional side view of an illustrative display frame having structures such as recesses configured to receive electrical components in accordance with an embodiment.

FIG. 17 is a cross-sectional side view of a portion of frame 74 showing how frame 74 may have structures such as recesses that are configured to receive components 50. Components 50 may be sensors such as ambient light sensors, digital image sensors (e.g., visible light and/or infrared light cameras), light sources such as infrared light sources that emit one or more beams of infrared light, visible light sources, infrared proximity sensors (e.g., proximity sensors using infrared light emitters configured to emit infrared light and infrared light detectors configured to monitor emitted infrared light that is reflected from objects in the vicinity of device 10), and/or other electrical components. These components may be optical components that emit and/or receive light through overlapping layers such as layer 84 (e.g., optical sensors, light source, etc.). Layer 84 may include display cover layer 40, opaque masking material on selected inner surface portions of layer 40, adhesive layers, touch sensor layers (e.g., touch sensor layers with arrays of capacitive touch sensor electrodes that cover all or part of the front face, rear face, and/or sidewalls of device 10), display layer 42, and/or other structures in device 10.

Figure 18:
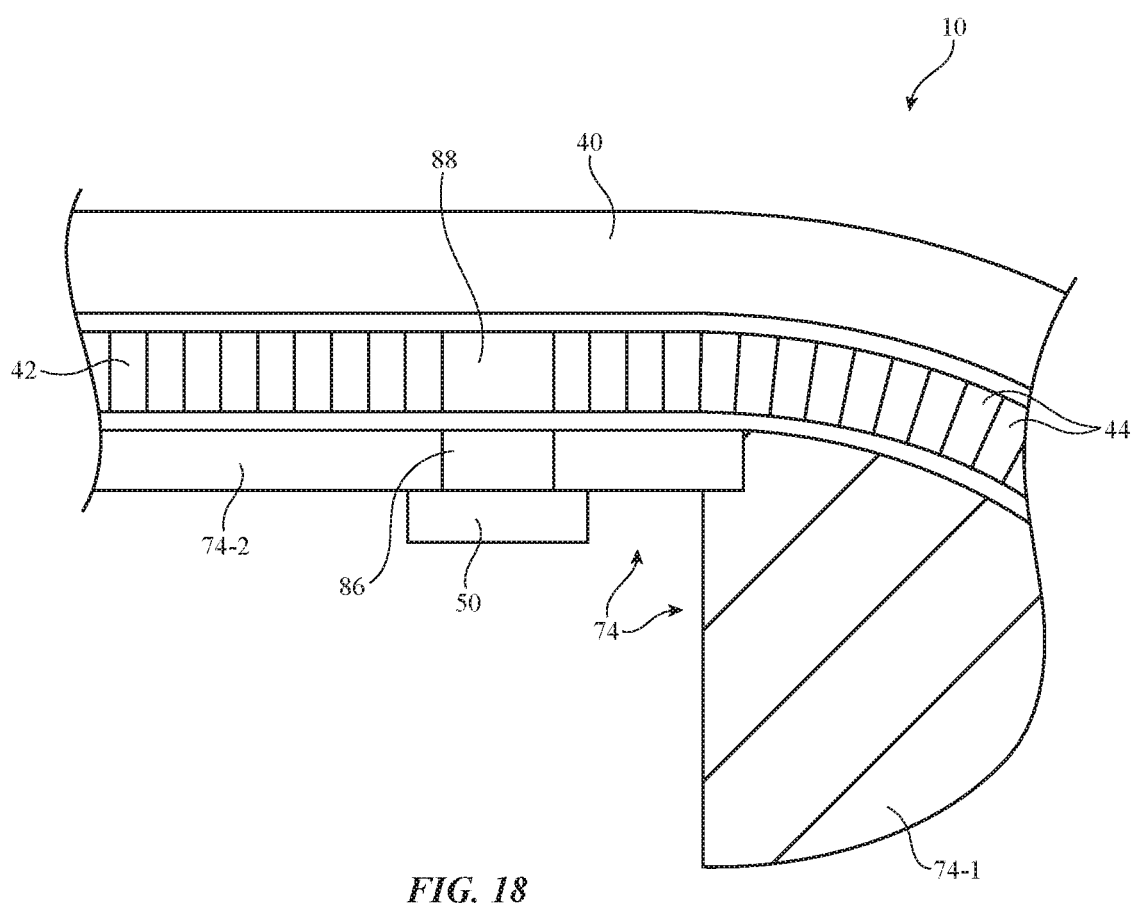
FIG. 18 is a cross-sectional side view of an illustrative electronic device showing how a display frame and display layer may have portions configured to accommodate an electrical component such as an optical sensor or other optical component in accordance with an embodiment.

Another illustrative arrangement for accommodating components in device 10 is shown in FIG. 18. In the arrangement of FIG. 18, frame 74 is formed from frame portion 74-1 (e.g., a polymer frame structure) and frame portion 74-2 (e.g., a metal frame structure). Frame portion 74-2 may have one or more openings such as opening 86. Component 50 (e.g., an optical sensor, light source, or other optical component such as one or more of the illustrative optical components described in connection with FIG. 17), may be aligned with opening 86 in frame 74. Adhesive, a mounting bracket, fasteners, or other mounting structures may be used in coupling component 50 to the inner surface of frame 74 or otherwise supporting component 50 adjacent to the inner surface of frame 74. Display cover layer 40 may overlap frame 74 and opening 86 in frame portion 74-2. Display layer 42 which may be mounted to the exterior surface of frame 74 using adhesive and may be interposed between display cover layer 40 and frame 74. As shown in FIG. 18, display layer 42 may have a transparent window such as window 88. Window 88 may be provided with enhanced transparency relative to other portions of display layer 42 by omitting some or all pixels 44 and associated interconnect lines and other supporting circuitry from window 88. The pixels 44 in display layer 42 that display images for the user of device 10 may surround window 88. Window 88 may be aligned with opening 86 of frame 74 and component 50. This allows infrared and/or visible light that is emitted by component 50 to pass through opening 86, window 88 and display cover layer 40 to the exterior of device 10 and allows infrared and/or visible light from the exterior of device 10 to pass to component 50 through display cover layer 40, window 88, and opening 86.

Figure 19:
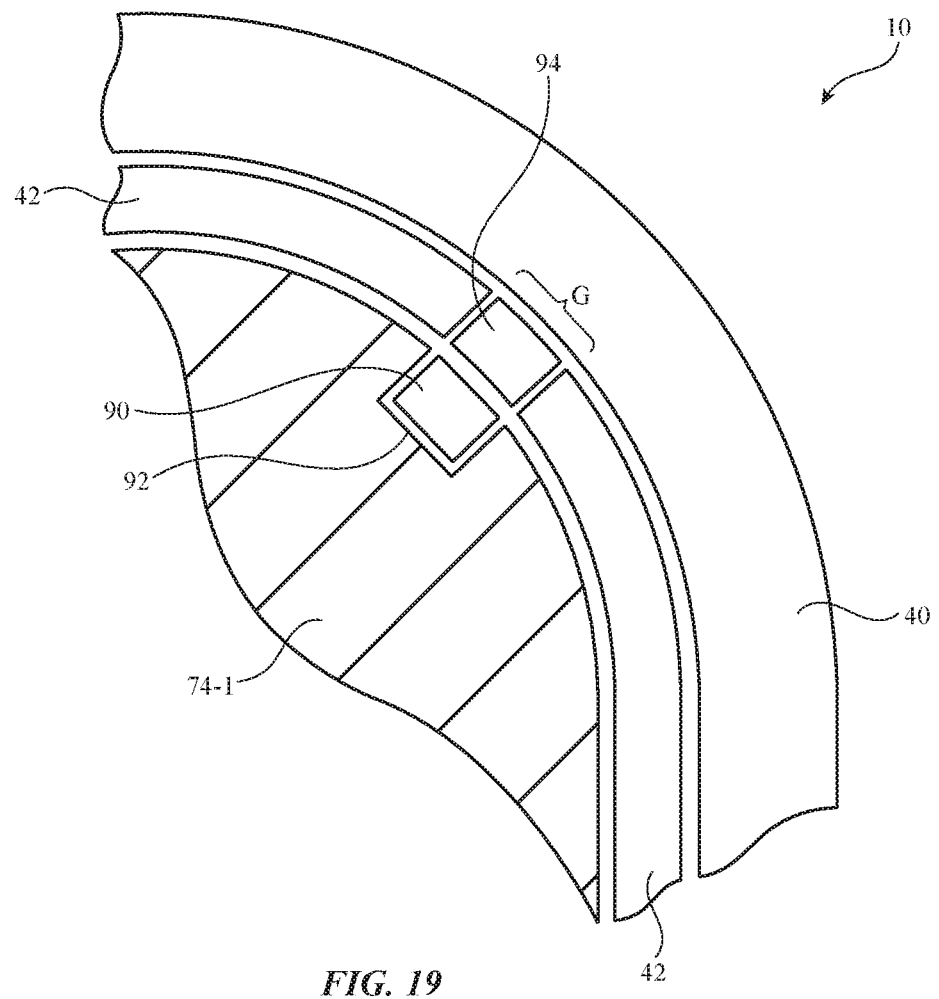
FIG. 19 is a cross-sectional side view of an illustrative corner portion of an electronic device showing how the device may have an optical component such as a light-emitting component that emits light into a display gap in accordance with an embodiment.

Display layer gaps (e.g., areas without display substrate material and without pixels 44) may be created when portions of display layer 42 (and sets of pixels on these display layer structures) are separated from each other. As shown in FIG. 19, for example, display layer 42 may have edge portions that are separated by gap G. Gaps such as gap G of FIG. 19 may, for example, be formed in the seams between distinct display panels (e.g., gaps between sets of pixels on adjacent organic light-emitting diode display substrates that are separated from each other) or may be formed between sets of pixels on nearby edges of a common display panel (e.g., the edges of a single display layer 42 that has been bent around the corner of a device or that has otherwise been formed into a shape in which the pixels of different portions of the display layer are separated by a gap that does not contain pixels and/or other layers of the display such as substrate material).

To help blend gap G visually with adjacent structures, gap G may be overlapped by structures such as structure 94. Structure 94, which may sometimes be referred to as a gap-overlapping structure, may be formed from colored polymer, polymer coated with an ink or other colored material (e.g., a polymer coating layer with a colorant such as a dye or pigment), may be formed from a thin coating layer on the inner surface of layer 40, may be formed from multiple structures (e.g., one or more structures formed from polymer, metal, glass, ceramic, other materials, and/or combinations of these materials that create a desired appearance for gap G when viewed from the exterior of device 10 through display cover layer 40), or may be formed from other gap-overlapping components.

If desired, light-emitting devices may be used to emit light into gaps such as gap G. As an example, structure 94 may be transparent to light. Component 90 may be formed in recess 92 of frame 74 (e.g., in frame portion 74-1) or may be received and supported by other portions of frame 74. Component 90 may be an optical component (e.g., a light source or optical sensor) or any other suitable electrical component (see, e.g., components 50 of FIG. 3). In arrangements in which component 90 is a light-emitting component, emitted light from component 90 may pass through structure 94. Structure 94 may be hazy and may therefore serve as a diffuser. For example, structure 94 may be formed from a transparent material such as glass or plastic that incorporates bubbles, light-scattering particles, surface textures, diffusing coatings (e.g., coatings formed from light-diffusing polymer layers containing bubbles, light-scattering inorganic particles, textures, and/or other light-scattering structures), and/or structures 94 and/or nearby portions of device 10 (e.g., overlapping portions of layer 40, interposed polymer layers, etc.) may be provided with light diffusing structures.

A diffuser formed in this way in device 10 may overlap component 90 and may diffuse emitted light from component 90, so that gap G emits diffuse light. This may help visually blend gap G with images created by the pixels in adjacent portions of display layer 42 during operation. Component 90 may include one or more crystalline light-emitting diodes of one or more different respective colors, one or more laser diodes of one or more different colors, or other light sources. If desired, light guides (e.g., light guide films, optical fibers, etc.) can be used in guiding light from a light source (e.g., a crystalline semiconductor light-emitting diode or laser) to gap G. At gap G, the light guide may emit the guided light (e.g., through a diffuser overlapping gap G).

The foregoing is merely illustrative and various modifications can be made to the described embodiments. The foregoing embodiments may be implemented individually or in any combination.

What is claimed is:

1. An electronic device, comprising:
a display cover layer having four peripheral edges;
an optical component;
a frame with four peripheral edge surfaces, wherein each of the four peripheral edge surfaces has a curved profile, the frame has a metal portion and a polymer portion, and the frame has an opening in the metal portion that is aligned with the optical component; and
a flexible display having a planar portion with first pixels and having four peripheral portions with curved edge profiles that are supported by the frame, wherein the four peripheral portions have second pixels that overlap the four peripheral edge surfaces of the frame.

2. The electronic device defined in claim 1 wherein the display cover layer has a first portion overlapping the first pixels and has a second portion overlapping the second pixels, wherein the second portion is thicker than the first portion, and wherein the second portion has an exterior surface with a curved profile.

3. The electronic device defined in claim 2 wherein the polymer portion is configured to form the four peripheral edge surfaces.

4. The electronic device defined in claim 3 wherein the metal portion is overlapped by the first pixels.

5. The electronic device defined in claim 4 wherein the display cover layer comprises a layer of glass and wherein the flexible display comprises an organic light-emitting diode display.

6. The electronic device defined in claim 1 wherein the display cover layer has a first portion and a second portion that are coupled at a seam.

7. The electronic device defined in claim 6 further comprising adhesive configured to couple the first and second portions at the seam.

8. The electronic device defined in claim 6 wherein the first portion has a transparent sidewall portion with a top and a bottom and wherein the seam is located at the bottom of the transparent sidewall portion.

9. The electronic device defined in claim 6 wherein the first portion and second portion each have symmetrical sidewall portions that are joined at the seam with adhesive.

10. The electronic device defined in claim 1 wherein the display cover layer has a first sidewall portion and a second sidewall portion, the electronic device further comprising a peripheral metal member between the first and second sidewall portions.

11. The electronic device defined in claim 1 wherein the flexible display has a transparent window surrounded by the first pixels, wherein the transparent window does not contain pixels, and wherein the transparent window is aligned with the opening.

12. The electronic device defined in claim 11 wherein the optical component comprises a component selected from the group consisting of: an ambient light sensor, an optical proximity sensor, a light-emitting diode, a laser, and a digital image sensor.

13. The electronic device defined in claim 1 wherein the flexible display has first and second edges separated by a gap and wherein the electronic device comprises a light source overlapped by the gap.

14. The electronic device defined in claim 1 wherein the display cover layer comprises a layer of glass with a surface of compound curvature that overlaps the flexible display.

* * * * *